United States Patent
Xu et al.

(10) Patent No.: US 9,641,127 B1
(45) Date of Patent: May 2, 2017

(54) OPERATIONAL TRANSCONDUCTANCE AMPLIFIER OF IMPROVED LINEARITY

(71) Applicant: Marvell International Ltd., Hamilton (BM)

(72) Inventors: Zhigang Xu, Shanghai (CN); Junxiong Deng, San Diego, CA (US); Taotao Yan, Shanghai, MN (US)

(73) Assignee: Marvell Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 14/731,194

(22) Filed: Jun. 4, 2015

Related U.S. Application Data

(60) Provisional application No. 62/008,831, filed on Jun. 6, 2014.

(51) Int. Cl.
| | | |
|---|---|---|
| H03F 3/26 | (2006.01) | |
| H03F 1/02 | (2006.01) | |
| H03F 3/45 | (2006.01) | |
| H04B 10/50 | (2013.01) | |
| H04B 10/564 | (2013.01) | |

(52) U.S. Cl.
CPC ....... *H03F 1/0205* (2013.01); *H03F 3/45179* (2013.01); *H04B 10/501* (2013.01); *H04B 10/564* (2013.01); *H03F 2203/45116* (2013.01); *H03F 2203/45118* (2013.01)

(58) Field of Classification Search
CPC ..................................... H03F 3/26; H03F 3/45
USPC ................................................. 330/255, 261
See application file for complete search history.

(56) References Cited

U.S. PATENT DOCUMENTS

| | | | | | |
|---|---|---|---|---|---|
| 3,622,903 | A | * | 11/1971 | Steckler | H03F 1/56 330/255 |
| 5,225,791 | A | * | 7/1993 | Ohta | H03F 3/3066 330/255 |
| 6,043,708 | A | * | 3/2000 | Barr | H03F 3/45219 330/253 |
| 6,356,153 | B1 | * | 3/2002 | Ivanov | H03F 3/3028 330/253 |
| 7,042,290 | B2 | * | 5/2006 | Zhang | H03F 3/3022 330/253 |
| 7,135,927 | B2 | * | 11/2006 | Parkhurst | H03F 1/3211 330/255 |
| 7,557,659 | B2 | * | 7/2009 | Harvey | H03F 3/4508 330/255 |
| 8,130,035 | B2 | * | 3/2012 | Weigandt | H03F 1/26 330/254 |

OTHER PUBLICATIONS

Zhigang Xu, et al.: Method and Apparatus to Reconfigure a Filter, U.S. Appl. No. 14/731,178, filed Jun. 4, 2015.

* cited by examiner

*Primary Examiner* — Henry Choe

(57) ABSTRACT

Aspects of the disclosure provide an operational transconductance amplifier (OTA) having an output stage. The output stage includes a first amplifier path configured to drive a first output current from a first power supply and a first resistor coupled between the first power supply and a source terminal of a first transistor in the first amplifier path. The first resistor is configured to improve a linearity of the OTA.

18 Claims, 5 Drawing Sheets

OPERATIONAL TRANSCONDUCTANCE AMPLIFIER OF IMPROVED LINEARITY

INCORPORATION BY REFERENCE

This present disclosure claims the benefit of U.S. Provisional Application No. 62/008,831, "Linearization Method Used for Two-stage Operational Transconductance Amplifier" filed on Jun. 6, 2014, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

An operational transconductance amplifier (OTA) is an amplifier that produces an output current in response to an input voltage. OTA can be a building block in various functional circuits, such as active filters, oscillators, multipliers and the like.

SUMMARY

Aspects of the disclosure provide an operational transconductance amplifier (OTA) having an output stage. The output stage includes a first amplifier path configured to drive a first output current from a first power supply and a first resistor coupled between the first power supply and a source terminal of a first transistor in the first amplifier path. The first resistor is configured to improve a linearity of the OTA.

In an embodiment, the first amplifier path includes a first common gate transistor cascaded with the first transistor of common source arrangement to drive the first output current from the first power supply. In an example, the first resistor is configured to have a resistance that reduces a third order harmonic distortion in the first output current.

According to an aspect of the disclosure, the output stage further includes a second amplifier path having a second common gate transistor and a second common source transistor cascaded to drive a second output current from the first power supply. A source terminal of the second common source transistor is coupled to a same node as the source terminal of the first transistor in the first amplifier path. The first amplifier path and the second amplifier path drive the first output current and the second output current in response to a pair of differential signals.

Further, in an embodiment, the output stage includes a third amplifier path having a third common gate transistor and a third common source transistor cascaded to drive the first output current from a second power supply. The first amplifier path and the third amplifier path are biased in class AB arrangement to drive the first output current. In an example, the output stage includes a second resistor coupled between the second power supply and a source terminal of a third transistor in the third amplifier path.

According to an aspect of the disclosure, the OTA includes an input stage configured to receive an input voltage and amplify the input voltage to generate an intermediate signal that is provided to the first amplifier path to control the first output current, and a level shifter configured to voltage-shift the intermediate signal to generate a shifted intermediate signal that is provided to the third amplifier path to control the first current from the second power supply. The level shifter includes a third resistor with resistance determined based on the first resistor to voltage-shift the intermediate signal.

In an embodiment, the OTA is used in a low pass filter to improve a linearity of the low pass filter without consuming excessive power. The low pass filter can be used in a transmitter circuit, such as a Long-Term Evolution (LTE) transmitter to satisfy performance requirement.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
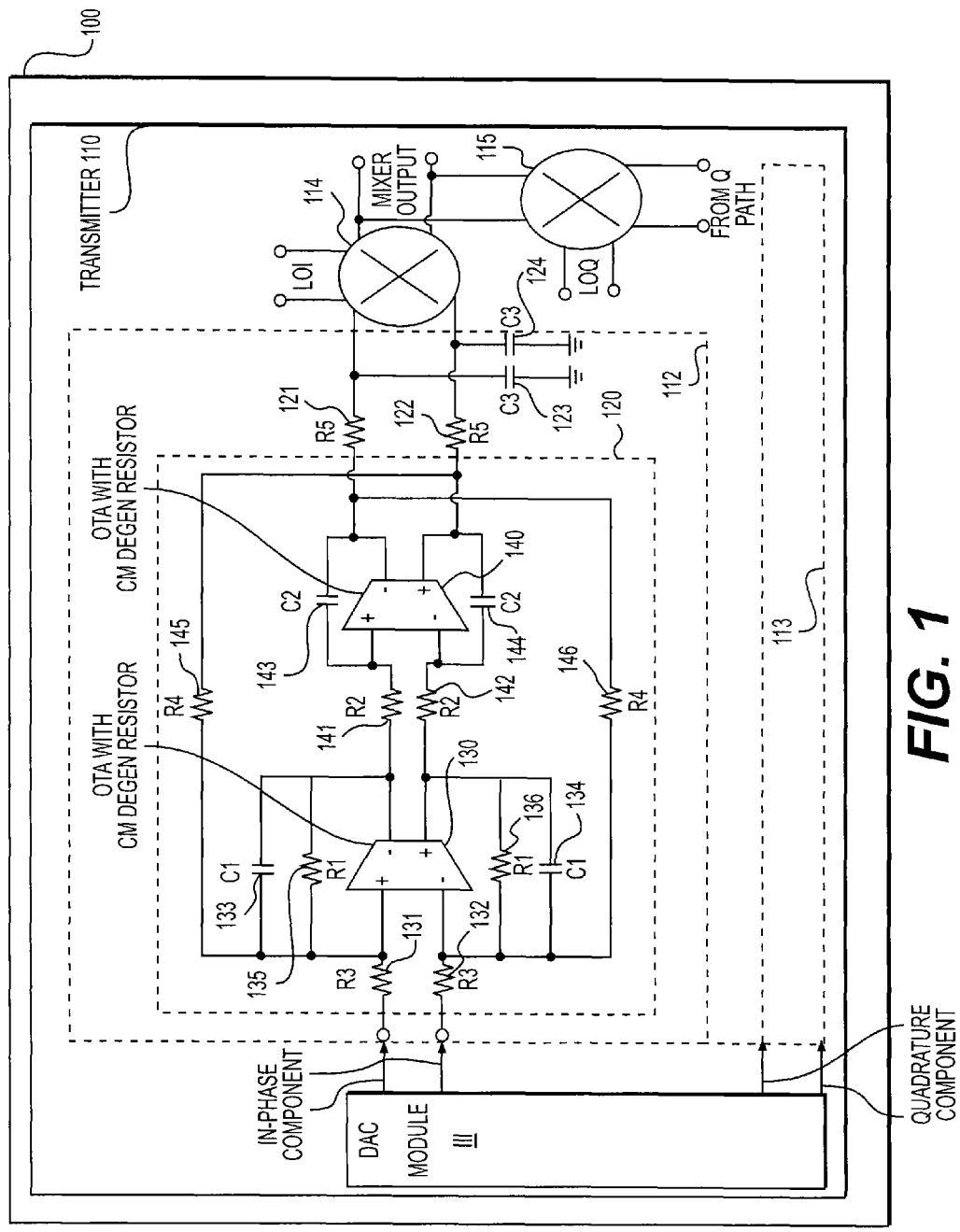
FIG. 1 shows a diagram of an electronic device 100 according to an embodiment of the disclosure.

FIG. 1 shows a diagram of an electronic device 100 according to an embodiment of the disclosure. The electronic device 100 includes at least one operational transconductance amplifier (OTA) that uses a common mode (CM) degeneration (DEGEN) resistor configured to improve OTA linearity. In the FIG. 1 example, the electronic device 100 includes a first OTA 130 and a second OTA 140 that use common mode degeneration resistors to improve OTA linearity.

The electronic device 100 can be any suitable device, such as a desktop computer, a laptop computer, a tablet computer, a smart phone, a network switch, an access point, a router, a set-top box, a television, and the like, that includes one or more operational transconductance amplifiers.

In an example, the electronic device 100 is a communication terminal device, such as a smart phone and the like, configured according to a Long-Term Evolution (LTE) standard for wireless communication of high-speed data. The electronic device 100 includes a transmitter 110 configured according to the LTE standard to transmit high speed data. The transmitter 110 has a relatively high requirement for filter linearity. For example, filters in the transmitter 110 need to satisfy a requirement for third order harmonic distortion, such as lower than 75 dBc, to achieve satisfactory transmitter performance.

Specifically, in the FIG. 1 example, the transmitter 110 includes various circuit components, such as a digital to analog converter (DAC) module 111, a first processing path (I-path) 112, a second processing path (Q-path) 113, a first mixer 114, a second mixer 115 and the like coupled together as shown in FIG. 1.

In an example, the DAC module 111 respectively converts an in-phase component and a quadrature component of data for transmission from a digital form to an analog form. The first processing path 112 filters the in-phase component to remove/reduce high frequency components that are the noise introduced during processing. The first mixer 114 receives and modulates an in-phase component (LOI) of a carrier signal to carry the in-phase component of the data and generates the in-phase component of the signal for transmission. Similarly, the second processing path 113 filters the quadrature component to remove/reduce high frequency components that are the noise introduced during processing. The second mixer 115 receives and modulates the quadrature component (LOQ) of the carrier signal to carry the quadrature component of the data and generates the quadrature component of the signal for transmission. The in-phase component and quadrature component of the signal for transmission are suitably combined as mixer output.

Specifically, the first processing path 112 includes a low pass filter 120, resistors 121-122 and capacitors 123-124 coupled together as shown in FIG. 1. In the FIG. 1 example, the low pass filter 120 is an OTA based differential biquad filter. In an example, the first mixer 114 has a relatively low passive input impedance. To reduce gain loss from the low pass filter 120 to the first mixer 114, the resistors 121-122 have relatively small resistance (R5), such as about 100 ohm or less. Further, the capacitors 123-124 have a relatively large capacitance (C3) in order to reduce out of band noise for the low pass filter 120. Due to the relatively small resistance of R5 and the relatively larger capacitance of C3, the low pass filter 120 has a relatively small loading impedance. Due to the relatively small loading impedance for the low pass filter 120, it is challenging to achieve good linearity while not consume excessive power. In an example, the linearity of the low pass filter 120 can be increased by increasing a loop gain. However, the loop gain increase requires more current and consumes more power.

According to an aspect of the disclosure, the low pass filter 120 is implemented using OTAs with high linearity to improve the filter linearity. Specifically, the low pass filter 120 includes a first OTA 130, a second OTA 140, resistors 131-132 of resistance R3, resistors 135-136 of resistance R1, resistors 141-142 of R2, resistors 145-146 of resistance R4, capacitors 133-134 of capacitance C1, and capacitors 143-144 of capacitance C2. These elements are coupled together as shown in FIG. 1. The first OTA 130, the resistors 131-132 and 135-136 and the capacitors 133-134 form a leaky integrator. The second OTA 140, the resistors 141-142 and the capacitors 143-144 form an integrator. The leaky integrator, the integrator and the resistors 145-146 form the low pass filter 120 which is a second-order (biquad) low pass filter.

In an embodiment, the second OTA 140 is implemented using a common mode degeneration resistor at an output stage to achieve relatively high linearity while not consume excessive power. Further, in an example, the first OTA 130 is also implemented using a common mode degeneration resistor at an output stage to achieve relatively high linearity while not consume excessive power. The linearity improvement of the second OTA 140 and the first OTA 130 improves the linearity of the low pass filter 120 without consuming excessive power.

It is also noted that, in an example, the transmitter 110 includes other components that are not shown, such as power amplifier, encoder, and the like. In an embodiment, the transmitter 110 is integrated with other circuit on an integrated circuit (IC) chip.

Figure 2:
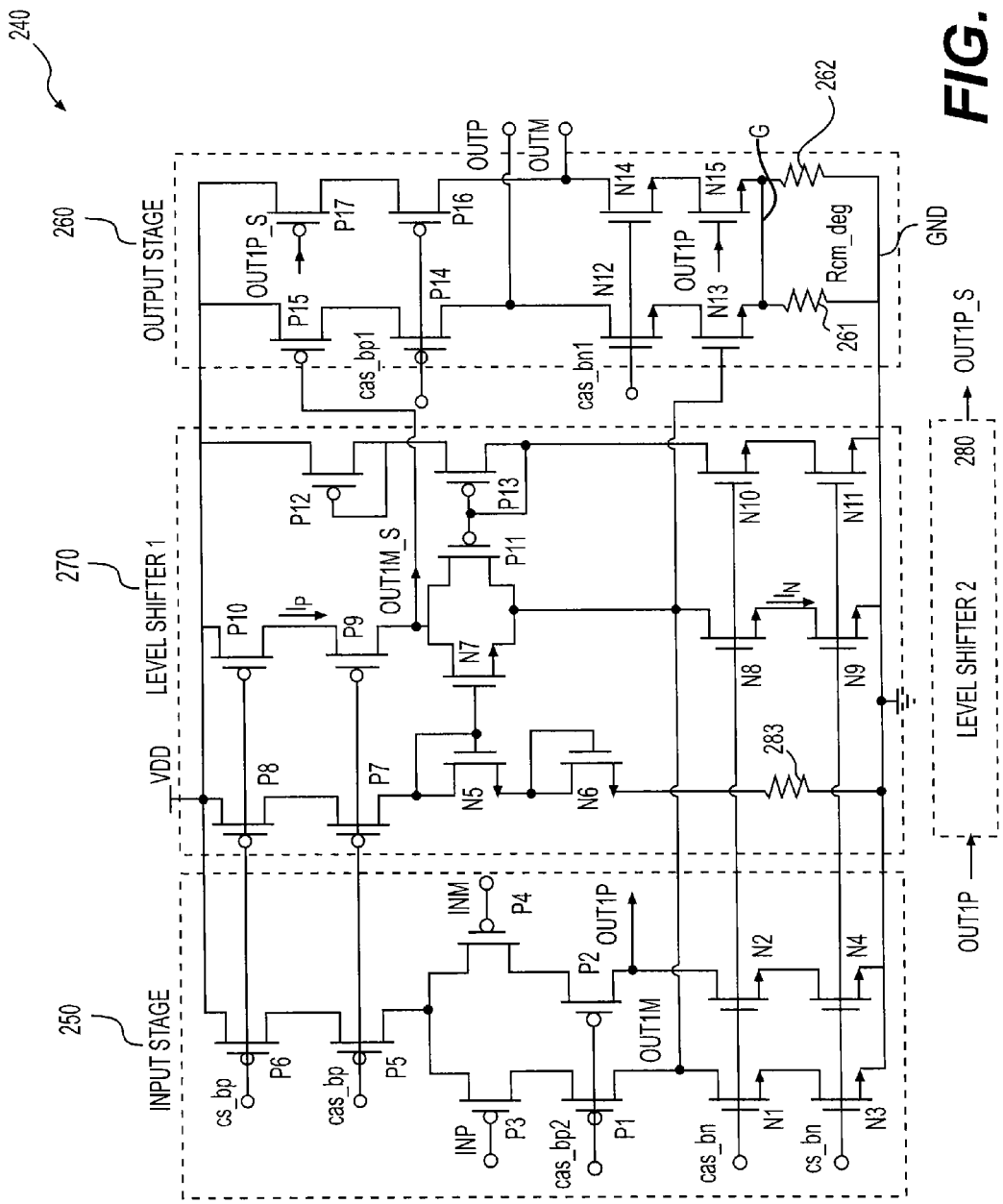
FIG. 2 shows a schematic diagram of an operational transconductance amplifier (OTA) 240 according to an embodiment of the disclosure.

FIG. 2 shows a schematic diagram of an operational transconductance amplifier (OTA) 240 according to an embodiment of the disclosure. The OTA 240 includes an input stage 250, a first level shifter 270, a second level shifter 280 and an output stage 260. The output stage 260 is implemented with one or more common mode degeneration resistors to improve OTA linearity. In an example, the OTA 240 can be used in the FIG. 1 example as the second OTA 140 and/or the first OTA 130.

In the FIG. 2 example, the input stage 250 receives a pair of differential voltage inputs INP and NM, amplifies, and outputs a pair of differential intermediate outputs OUT1P and OUT1M. The input stage 250 includes N-type metal-oxide-semiconductor field effect transistor (MOSFET) transistors N1-N4 and P-type MOSFET transistors P1-P6 coupled together as shown in FIG. 2.

Specifically, the P-type MOSFET transistors P3 and P1 are cascaded to form a first cascode amplifier, the P-type MOSFET transistor P4 and P2 are cascaded to form a second cascode amplifier. The first cascode amplifier and the second cascode amplifier are coupled to form a differential pair to receive the differential voltage inputs INP and NM. The P-type MOSFET transistor P5 and P6 form PMOS cascode current source. The N-type MOSFET transistors N1 and N3 are cascaded to form a first NMOS cascode current source and the N-type MOSFET transistors N2 and N4 are cascaded to form a second NMOS cascode current source. The first NMOS cascode current source and the second NMOS cascode current source are coupled with the cascode differential amplifier to act as NMOS cascode loads.

During operation, in an example, when the differential voltage inputs INP and INM are of the same voltage level, the first cascode amplifier and the second cascode amplifier are balanced, and the current provided by the PMOS cascode current source is equally divided between the first and second cascode amplifier. In an example, the first NMOS cascode current source and the second NMOS cascode current source are configured to each conduct one half of the current as the PMOS cascode current source, then the differential intermediate outputs OUT1M and OUT1P are of the same voltage level.

When the differential voltage inputs INP and INM are of different voltage levels, the current provided by the PMOS cascode current source is imbalanced between the first cascode amplifier and the second cascode amplifier. In an example, the first NMOS cascode current source and the second NMOS cascode current source are configured to each conduct one half of the current as the PMOS cascode current source, then the differential intermediates outputs OUT1M and OUT1P are of different voltage levels and have output current.

The first level shifter 270 and the second level shifter 280 suitably shift the intermediate outputs OUT1P and OUT1M to generate the shifted intermediate output OUT1P_S and OUT1_S to enable a class AB arrangement at the output stage 260.

The output stage 260 is configured to operate in class AB arrangement to drive differential current outputs OUTP and OUTM. According to the class AB arrangement, an output node is driven by two switching paths, and each of the switching paths has a conduction angle larger than 180° in response to an input.

In the FIG. 1 example, the output stage 260 includes N-type MOSFET transistors N12-N15, P-type MOSFET transistors P14-P17, and common mode degeneration resistors 261-262 coupled together as shown in FIG. 2.

In the example, the N-type MOSFET transistors N12 and N13 form a first NMOS cascode amplifier to drive the current output OUTP in response to the intermediate output OUT1M, the N-type MOSFET transistors N14 and N15 form a second NMOS cascode amplifier to drive the current output OUTM in response to the intermediate output OUT1P. In addition, in the FIG. 1 example, the source terminals of the N-type MOSFET transistors N13 and N15 are connected (node G) and the common mode degeneration resistors 261 and 262 of resistance Rcm_deg are coupled between the ground and the node G. In another example, the common mode degeneration resistors 261 and 262 can be replaced by a single resistor having half of the resistance Rcm_deg.

Similarly, the P-type MOSFET transistors P14 and P15 form a first PMOS cascode amplifier to drive the current output OUTP in response to the shifted intermediate output OUT1M_S, and the P-type MOSFET transistors P16 and P17 form a second PMOS cascode amplifier to drive the current output OUTM in response to the shifted intermediate output OUT1P-S.

According to an aspect of the disclosure, the output stage 260 is suitably biased and controlled to operate in class AB arrangement, such that the first cascode PMOS amplifier and the first cascode NMOS amplifier are not simultaneously off, and the second cascode PMOS amplifier and the second cascode PMOS amplifier are not simultaneously off.

The first level shifter 270 and the second level shifter 280 can use any suitable technique to shift the intermediate outputs OUT1P and OUT1M. In the FIG. 2 example, the first level shifter 270 includes P-type MOSFET transistors P7-P13, N-type MOSFET transistors N5-N11, and a resistor 283 coupled together as shown in FIG. 2.

Specifically, the P-type MOSFET transistors P7-P8, the N-type MOSFET transistors N5-N6 and the resistor 283 form a first bias circuit. The P-type MOSFET transistors P12-P13, and the N-type MOSFET transistors N10-N11 form a second bias circuit. The P-type MOSFET transistor P11 and the N-type MOSFET transistor N7 are coupled in transmission gate arrangement. The P-type MOSFET transistors P10 and P11 form a cascode PMOS current source to provide a current $I_P$ to the transmission gate arrangement, and the N-type MOSFET transistors N8 and N9 from a cascode NMOS current source to provide a current $I_N$ to the transmission gate arrangement.

For example, in an embodiment, at a steady state (e.g., OUT1M has no current output), the current $I_P$ and the current $I_N$ are about the same and are equally divided between N7 and P11. Then, the intermediate output OUT1M and the shifted intermediate output OUT1M_S control the first NMOS cascode amplifier and the first PMOS cascode amplifier to flow a constant bias current. When the intermediate output OUT1M has current, the current flows by transistors N7 and P11 is not equally divided. Then the intermediate output OUT1M and the shifted intermediate output OUT1M_S cause change in the currents flowing through the first PMOS cascode amplifier (P15 and P14) and the first NMOS cascode amplifier (N12 and N13), and then generates output current at OUTP.

It is noted that the resistor 283 is used to modify the bias for the shifted intermediate output OUT1M_S considering the introduction of the common mode degeneration resistors 261-262. The resistance of the resistor 283 can be suitably determined according to the common mode degeneration resistors 261-262. In an example, the resistance of the resistor 283 is multiple times of the Rcm_deg.

The second level shifter 280 can be similarly configured as the first level shifter 270 to level-shift the OUT1P to generate the shifted intermediate output OUT1P_S.

According to an aspect of the disclosure, third order harmonic distortion in the output current of output stage 260 comes from various sources, such as third order harmonic distortion from the input stage, non-linearity of the output stage 260, and the like. Using an N-type MOSFET transistor, such as N13 at the output stage 260 as an example, the gate voltage ($V_{gn}$) of the N-type MOSFET transistor can be expressed as Eq. 1

$$V_{gn} = H_{1n}\cos(\omega t + \theta_{1n}) + H_{2n}\cos(2\omega t + \theta_{2n}) H_{3n}\cos(3\omega t + \theta_{3n})$$ Eq. 1 where $H_{1n}$ and $\theta_{1n}$ denote the magnitude and phase of the baseband signal received at the gate of the N-type MOSFET transistor, $H_{2n}$ and $\theta_{2n}$ denote the magnitude and phase of the second order harmonic received at the gate of the N-type MOSFET transistor, $H_{3n}$ and $\theta_{3n}$ denote the magnitude and phase of the third order harmonic received at the gate of the N-type MOSFET transistor, $\omega$ denotes the baseband angular velocity, and t denotes time.

Further, in an embodiment, the relationship of output current ($i_n$) from the N-type MOSFET transistor to the gate voltage ($V_{gn}$) can be expressed as Eq. 2:

$$i_n = \alpha_1 V_{gn} + \alpha_2 V_{gn}^2 + \alpha_3 V_{gn}^3$$ Eq. 2 where $\alpha_1$ denotes linear coefficient (gain), $\alpha_2$ denotes second order coefficient, and $\alpha_3$ denotes third order coefficient. Thus, the third order harmonic distortion ($i_{3rd\_n}$) in the output current can be expressed as Eq. 3:

$$i_{3rd\_n} = \alpha_1 H_{3n}\cos(3\omega t + \theta_{3n}) + \alpha_2 H_{1n} H_{2n}\cos(3\omega t + \theta_{1n} + \theta_{2n}) + \frac{\alpha_3 H_{1n}^3}{4}\cos(3\omega t + 3\theta 1n)$$ Eq. 3

In the embodiment, the third order harmonic distortion in the output current has three portions as shown in Eq. 3. The first portion is due to the third order harmonic distortion output from the input stage 250, the second portion is due to the second order harmonic distortion output from the input stage 250 and the second order nonlinearity of the output stage 260, and the third portion is due to the third order nonlinearity of the output stage 260.

It is noted that similar analysis can be performed on the P-type MOSFET transistor.

According to an aspect of the disclosure, the use of the common mode degeneration resistors 261 and 262 in the OTA 240 reduces the second order nonlinearity (e.g., reducing second order coefficient $\alpha_2$). In an embodiment, when the resistance Rcm_deg is relatively small, such as about 100 ohm, the second portion dominates the third order harmonic in the output current; and when the resistance Rcm_deg is relatively large, such as over 200 ohm, the first portion can be dominant. Thus, in an example, the resistance Rcm_deg can be determined during transmitter design to minimize the third order harmonic distortion in the output current from the OTA 240. Thus, the linearity of the OTA 240 is improved.

It is noted that the OTA 240 can include other suitable circuits that are not shown. In an example, the OTA 2040 includes a bias circuit (not shown) to generate suitable bias voltages, such as cs_bp, cas_bp, cas_bp1, cas_bp2, cs_bn, cas_bn, cas_bn1 and the like.

Figure 3:
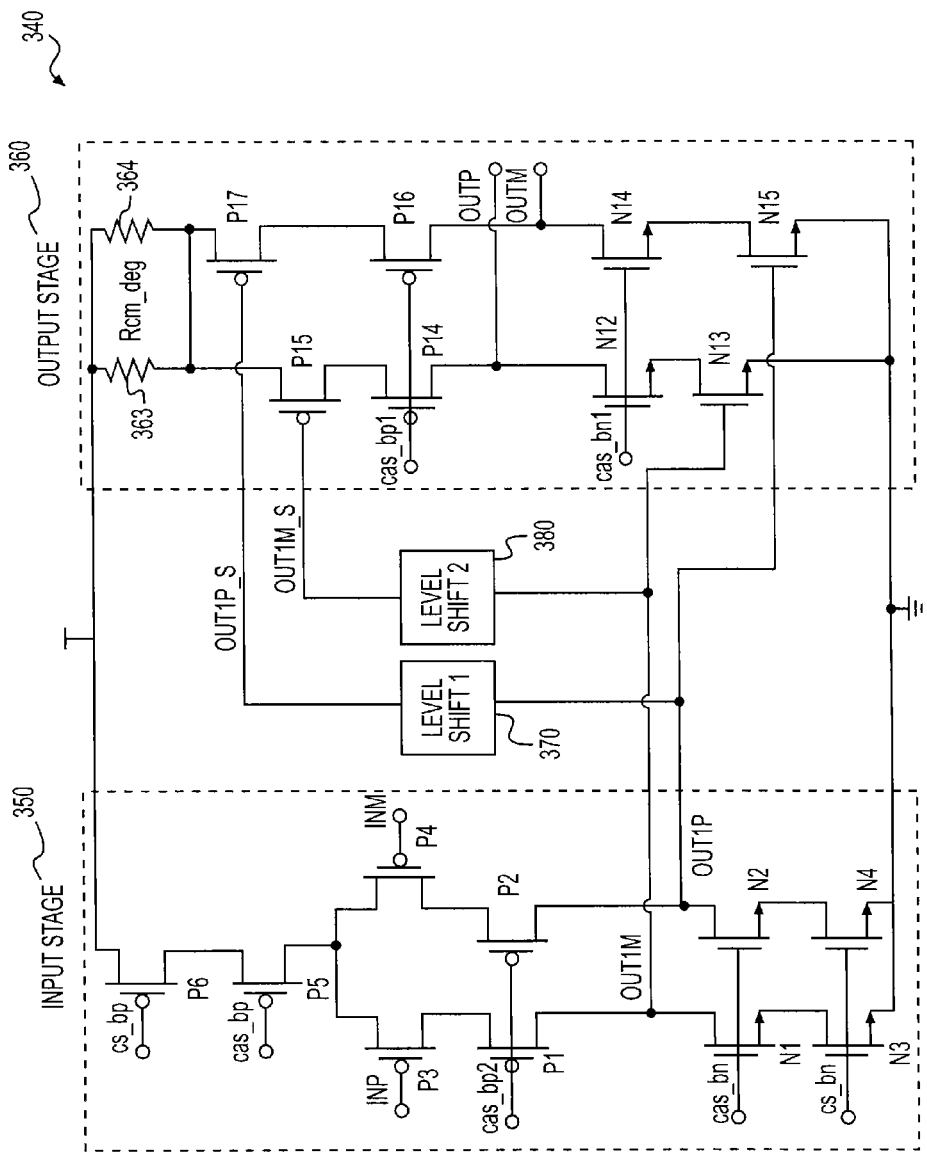
FIG. 3 shows a schematic diagram of another OTA 340 according to an embodiment of the disclosure.

FIG. 3 shows a schematic diagram of another OTA 340 according to an embodiment of the disclosure. The OTA 340 operates similarly to the OTA 240 described above. The OTA 340 utilizes certain components that are identical or equivalent to those used in the OTA 240; the description of these components has been provided above and will be omitted here for clarity purposes. However, in this embodiment, the OTA 340 includes the common mode degeneration resistors 363 and 364 coupled between the power supply VDD and the source terminals of the P-type MOSFET transistors P15 and P17, and the OTA 340 does not include the common mode degeneration resistors coupled to the ground.

It is noted that, in the example, the level shifters 370 and 380 are suitably modified from the first level shifter 270.

Figure 4:
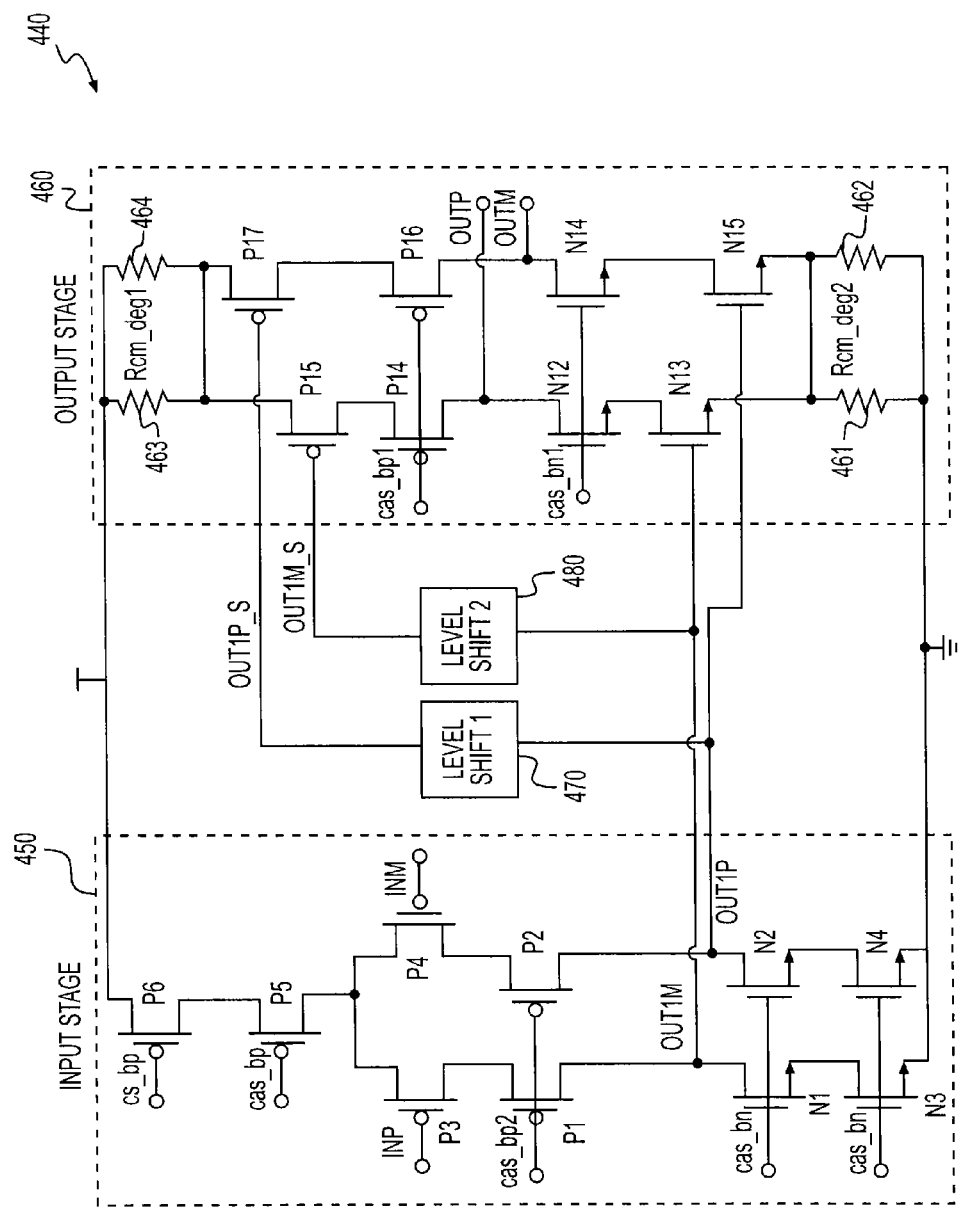
FIG. 4 shows a schematic diagram of another OTA 440 according to an embodiment of the disclosure.

FIG. 4 shows a schematic diagram of another OTA 440 according to an embodiment of the disclosure. The OTA 440 operates similarly to the OTA 240 and the OTA 340 described above. The OTA 440 utilizes certain components that are identical or equivalent to those used in the OTA 240 and OTA 340; the description of these components has been provided above and will be omitted here for clarity purposes. However, in this embodiment, the OTA 440 includes common mode degeneration resistors 461 and 462 coupled between ground and the source terminals of the N-type MOSFET transistors N13 and N15 and also includes common mode degeneration resistors 463 and 464 coupled between the power supply VDD and the source terminals of the P-type MOSFET transistors P15 and P17. It is noted that the common mode degeneration resistors 461 and 462 can have the same or different resistance from the common mode degeneration resistors 463 and 464.

It is noted that, in the example, the level shifters 470 and 480 are suitably modified from the first level shifter 270.

Figure 5:
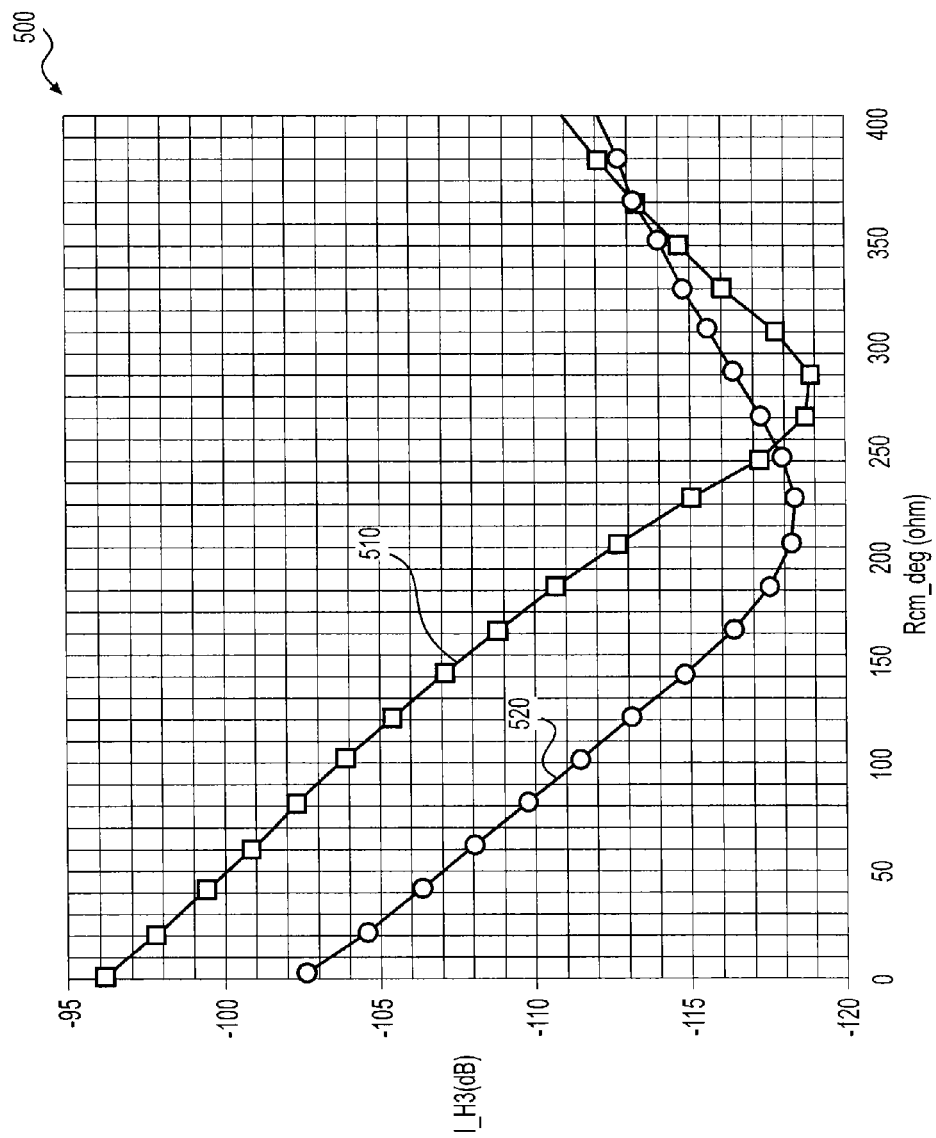
FIG. 5 shows a plot 500 according to an embodiment of the disclosure.

FIG. 5 shows a plot 500 illustrating a relationship of the third order harmonic distortion and the resistance of common mode degeneration resistor according to an embodiment of the disclosure. In the plot 500, X-axis represents the resistance of the common mode degeneration resistor, and the Y-axis represents the third order harmonic distortion in the output current. The plot 500 includes a first curve 510 and a second curve 520. The first curve 510 shows a simulation result for the OTA 240, and the second curve 520 shows a theoretical calculation result for the OTA 240.

According to plot 500, in the embodiment, the third order harmonic distortion in the output current reduces with the increase of the common mode degeneration resistance when the common mode degeneration resistance is smaller than 200 ohm, and the third order harmonic distortion in the output current increases with the increase of the common mode degeneration resistance when the common mode degeneration resistance is larger than 300 ohm. Thus, in an example, the common mode degeneration resistance for the OTA 240 is determined to be about 255 ohm. In an example, the OTA 240 is used to implement the low pass filter 120, and the low pass filter 120 achieves −92.5 dBc third order harmonic distortion. Without the common mode degeneration resistance, the low pass filter 120 achieves −80 dBc third order harmonic distortion.

When implemented in hardware, the hardware may comprise one or more of discrete components, an integrated circuit, an application-specific integrated circuit (ASIC), etc.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An operational transconductance amplifier having an output stage, the output stage comprising:
   a pair of differential current outputs derived by a pair of differential input voltages;
   a first amplifier path configured to drive a first output current of the pair of differential current outputs from a first power supply of a pair of power supplies controlled by the pair of differential input voltages, wherein the first amplifier path comprises a first common gate transistor cascaded with a first transistor of common source arrangement to drive the first output current from the first power supply;
   a second amplifier path configured to drive a second output current of the pair of differential current outputs from the first power supply of the pair of power supplies controlled by the pair of differential input voltages; and
   a first resistor coupled between the first power supply and a source terminal of the first transistor in the first amplifier path, the first resistor being configured to improve a linearity of the operational transconductance amplifier.

2. The operational transconductance amplifier of claim 1, wherein the first resistor is configured to have a resistance that reduces a third order harmonic distortion in the first output current.

3. The operational transconductance amplifier of claim 1, wherein the second amplifier path has a second common gate transistor and a second common source transistor cascaded to drive the second output current from the first power supply, a source terminal of the second common source transistor being coupled to a same node as the source terminal of the first transistor in the first amplifier path.

4. The operational transconductance amplifier of claim 3, wherein the first amplifier path and the second amplifier path drive the first output current and the second output current in response to a pair of differential signals.

5. The operational transconductance amplifier of claim 1, wherein the output stage further comprises:
   a third amplifier path having a third common gate transistor and a third common source transistor cascaded to drive the first output current from a second power supply of the pair of power supplies.

6. The operational transconductance amplifier of claim 5, wherein the first amplifier path and the third amplifier path are biased in class AB arrangement to drive the first output current.

7. The operational transconductance amplifier of claim 5, wherein the output stage further comprises:
   a second resistor coupled between the second power supply and a source terminal of a third transistor in the third amplifier path.

8. The operational transconductance amplifier of claim 5, further comprising:
   an input stage configured to receive an input voltage and amplify the input voltage to generate an intermediate signal that is provided to the first amplifier path to control the first output current; and
   a level shifter configured to voltage-shift the intermediate signal to generate a shifted intermediate signal that is provided to the third amplifier path to control the first output current from the second power supply.

9. The operational transconductance amplifier of claim 8, wherein the level shifter comprises:
   a third resistor with resistance determined based on the first resistor to voltage-shift the intermediate signal.

10. A transmitter circuit having an operational transconductance amplifier, the operational transconductance amplifier having an output stage, the output stage comprising:

a pair of differential current outputs derived by a pair of differential input voltages;

a first amplifier path configured to drive a first output current of the pair of differential current outputs from a first power supply of a pair of power supplies controlled by the pair of differential input voltages, wherein the first amplifier path comprises a first common gate transistor cascaded with a first transistor of common source arrangement to drive the first output current from the first power supply;

a second amplifier path configured to drive a second output current of the pair of differential current outputs from the first power supply of the pair of power supplies controlled by the pair of differential input voltages; and a first resistor coupled between the first power supply and a source terminal of the first transistor in the first amplifier path, the first resistor being configured to improve a linearity of the operational transconductance amplifier.

11. The transmitter circuit of claim 10, wherein the first resistor is configured to have a resistance that reduces a third order harmonic distortion in the first output current.

12. The transmitter circuit of claim 10, wherein the second amplifier path has a second common gate transistor and a second common source transistor cascaded to drive the second output current from the first power supply, a source terminal of the second common source transistor being coupled to a same node as the source terminal of the first transistor in the first amplifier path.

13. The transmitter circuit of claim 12, wherein the first amplifier path and the second amplifier path drive the first output current and the second output current in response to a pair of differential signals.

14. The transmitter circuit of claim 10, wherein the output stage further comprises:

a third amplifier path having a third common gate transistor and a third common source transistor cascaded to drive the first output current from a second power supply of the pair of power supplies.

15. The transmitter circuit of claim 14, wherein the first amplifier path and the third amplifier path are biased in class AB arrangement to drive the first output current.

16. The transmitter circuit of claim 14, wherein the output stage further comprises:

a second resistor coupled between the second power supply and a source terminal of a third transistor in the third amplifier path.

17. The transmitter circuit of claim 14, further comprising:

an input stage configured to receive an input voltage and amplify the input voltage to generate an intermediate signal that is provided to the first amplifier path to control the first output current; and a level shifter configured to voltage-shift the intermediate signal to generate a shifted intermediate signal that is provided to the third amplifier path to control the first output current from the second power supply.

18. The transmitter circuit of claim 17, wherein the level shifter comprises:

a third resistor with resistance determined based on the first resistor to voltage-shift the intermediate signal.

\* \* \* \* \*